(12) United States Patent
Honke et al.

(10) Patent No.: US 11,322,349 B2
(45) Date of Patent: May 3, 2022

(54) SILICON CARBIDE SUBSTRATE AND SILICON CARBIDE EPITAXIAL SUBSTRATE

(71) Applicant: SUMITOMO ELECTRIC INDUSTRIES, LTD., Osaka (JP)

(72) Inventors: Tsubasa Honke, Osaka (JP); Kyoko Okita, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 273 days.

(21) Appl. No.: 16/614,016

(22) PCT Filed: Apr. 3, 2018

(86) PCT No.: PCT/JP2018/014232
§ 371 (c)(1),
(2) Date: Nov. 15, 2019

(87) PCT Pub. No.: WO2018/211842
PCT Pub. Date: Nov. 22, 2018

(65) Prior Publication Data
US 2020/0083039 A1 Mar. 12, 2020

(30) Foreign Application Priority Data
May 19, 2017 (JP) .............................. JP2017-099853

(51) Int. Cl.
*H01L 21/02* (2006.01)
*C30B 29/36* (2006.01)
*H01L 21/304* (2006.01)

(52) U.S. Cl.
CPC ........ *H01L 21/02529* (2013.01); *C30B 29/36* (2013.01); *H01L 21/304* (2013.01)

(58) Field of Classification Search
CPC ......... H01L 21/02529; H01L 21/02378; H01L 21/304; H01L 21/02024; H01L 21/02658;
(Continued)

(56) References Cited

U.S. PATENT DOCUMENTS

2007/0269980 A1* 11/2007 Rayfield ................ B28D 5/022
438/678
2012/0068155 A1 3/2012 Ishibashi
(Continued)

FOREIGN PATENT DOCUMENTS

CN 102471931 A 5/2012
CN 102528646 A 7/2012
(Continued)

OTHER PUBLICATIONS

Jie Zhang, Bernd Thomas, Kevin Moeggenborg, Victor M Torres, Darren Hansen, Progress of SiC epitaxy on 150mm substrates, Jun. 2015, Trans Tech Publications, Switzerland, Materials Science Forum vols. 821-823 (2015) pp. 161-164 (Year: 2015).*
(Continued)

*Primary Examiner* — Khaja Ahmad
*Assistant Examiner* — Pavel G Ivanov
(74) *Attorney, Agent, or Firm* — Faegre Drinker Biddle & Reath LLP

(57) ABSTRACT

A TTV of the silicon carbide substrate is less than or equal to 3 μm. The first main surface includes a first central region surrounded by a square having each side of 90 mm. An intersection of diagonal lines of the first central region coincides with a center of the first main surface. The first central region is constituted of nine square regions each having each side of 30 mm. A maximum LTV among the nine square regions is less than or equal to 1 μm. An arithmetic mean roughness Sa in a second central region is less than or equal to 0.1 nm, the second central region being surrounded by a square centering on the intersection and having each side of 250 μm.

4 Claims, 7 Drawing Sheets

(58) Field of Classification Search
CPC ........... H01L 21/02433; H01L 21/0243; H01L 21/0262; C30B 29/36
See application file for complete search history.

(56) References Cited

U.S. PATENT DOCUMENTS

| | | |
|---|---|---|
| 2012/0104558 A1 | 5/2012 | Ishibashi |
| 2013/0020585 A1 | 1/2013 | Ishibashi |
| 2017/0159208 A1 | 6/2017 | Aigo et al. |
| 2018/0245238 A1* | 8/2018 | Hori .................... C30B 25/20 |

FOREIGN PATENT DOCUMENTS

| | | |
|---|---|---|
| CN | 102576787 A | 7/2012 |
| CN | 106463364 A | 2/2017 |
| CN | 108336127 A | 7/2018 |
| JP | 2016-210680 A | 12/2016 |

OTHER PUBLICATIONS

Tobias Höchbauera, Mario Leitner, Ronny Kern, Matthias Kunie, SiC Epitaxial Growth in a 7×100mm / 3×150mm Horizontal Hot Wall Batch Reactor, Trans Tech Publications, Switzerland, Jun. 2015, Materials Science Forum ISSN: 1662-9752, vols. 821-823, pp. 165-168 (Year: 2015).*

* cited by examiner

SILICON CARBIDE SUBSTRATE AND SILICON CARBIDE EPITAXIAL SUBSTRATE

TECHNICAL FIELD

The present disclosure relates to a silicon carbide substrate and a silicon carbide epitaxial substrate. The present application claims a priority based on Japanese Patent Application No. 2017-099853 filed on May 19, 2017, the entire content of which is incorporated herein by reference.

BACKGROUND ART

Japanese Patent Laying-Open No. 2016-210680 (Patent Literature 1) describes a silicon carbide single-crystal substrate allowing for suppression of positional deviation of a mask pattern in a photolithography step.

CITATION LIST

Patent Literature

PTL 1: Japanese Patent Laying-Open No. 2016-210680

SUMMARY OF INVENTION

A silicon carbide substrate according to the present disclosure includes a first main surface and a second main surface opposite to the first main surface, the silicon carbide substrate being composed of silicon carbide having a polytype of 4H. A maximum diameter of the first main surface is more than or equal to 150 mm. The first main surface corresponds to a plane inclined relative to a {0001} plane by more than 0° and less than or equal to 4° in a <11-20> direction. A TTV of the silicon carbide substrate is less than or equal to 3 µm. The first main surface includes a first central region surrounded by a square having each side of 90 mm. An intersection of diagonal lines of the first central region coincides with a center of the first main surface. The first central region is constituted of nine square regions each having each side of 30 mm. A maximum LTV among the nine square regions is less than or equal to 1 µm. An arithmetic mean roughness Sa in a second central region is less than or equal to 0.1 nm, the second central region being surrounded by a square centering on the intersection and having each side of 250 µm.

A silicon carbide epitaxial substrate according to the present disclosure includes a silicon carbide substrate and a silicon carbide epitaxial layer. The silicon carbide substrate includes a first main surface and a second main surface opposite to the first main surface, the silicon carbide substrate being composed of silicon carbide having a polytype of 4H. The silicon carbide epitaxial layer is in contact with the first main surface. A thickness of the silicon carbide epitaxial layer is more than or equal to 10 µm. The silicon carbide epitaxial layer includes a third main surface in contact with the first main surface and a fourth main surface opposite to the third main surface. A maximum diameter of the fourth main surface is more than or equal to 150 mm. The fourth main surface corresponds to a plane inclined relative to a {0001} plane at an off angle of more than 0° and less than or equal to 4° in a <11-20> direction. A TTV of the silicon carbide epitaxial substrate is less than or equal to 3 µm. The fourth main surface includes a first central region surrounded by a square having each side of 90 mm. An intersection of diagonal lines of the first central region coincides with a center of the fourth main surface. The first central region is constituted of nine square regions each having each side of 30 mm. A maximum LTV among the nine square regions is less than or equal to 1 µm. An arithmetic mean roughness Sa in a second central region is less than or equal to 0.12 nm, the second central region being surrounded by a square centering on the intersection and having each side of 250 µm. The fourth main surface has no light emitting region having a length of more than or equal to 26 µm in a <1-100> direction when observed with photoluminescence light.

DETAILED DESCRIPTION

Figure 1:
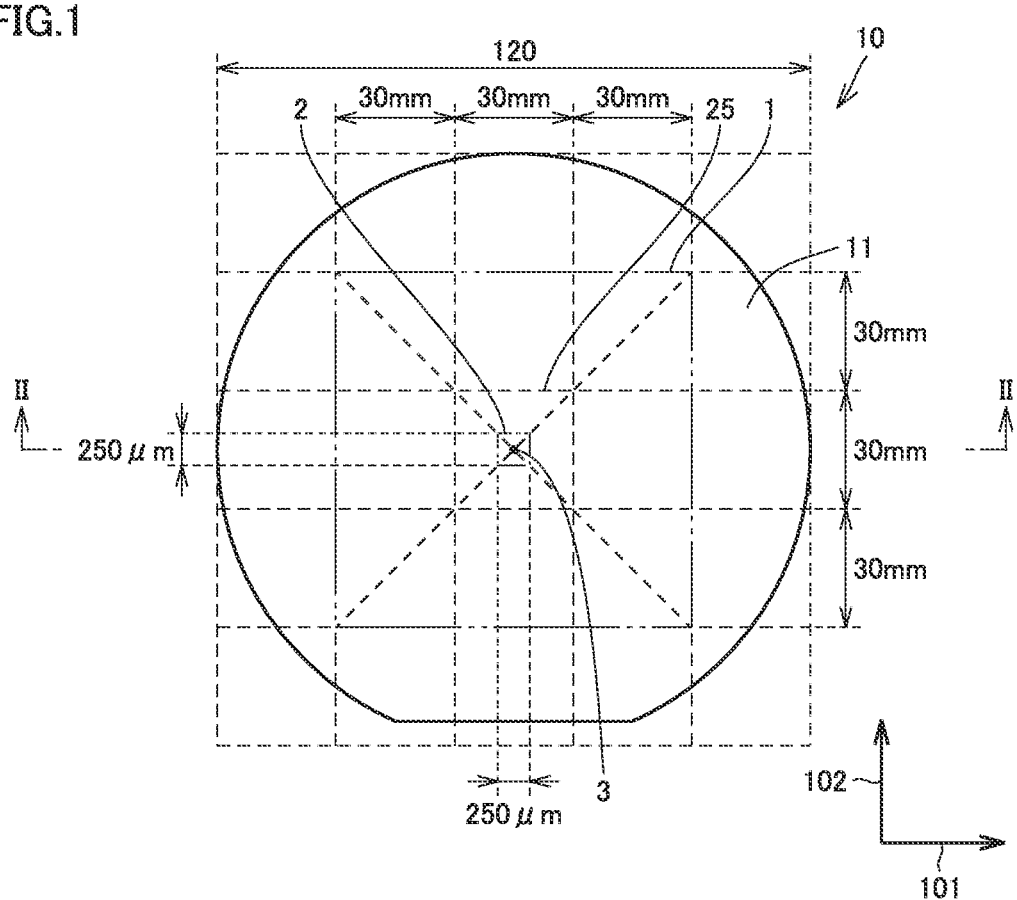
FIG. 1 is a schematic plan view showing a structure of a silicon carbide substrate according to a first embodiment.

Description of Embodiments (1) A silicon carbide substrate according to the present disclosure includes a first main surface and a second main surface opposite to the first main surface, the silicon carbide substrate being composed of silicon carbide having a polytype of 4H. A maximum diameter of the first main surface is more than or equal to 150 mm. The first main surface corresponds to a plane inclined relative to a {0001} plane by more than 0° and less than or equal to 4° in a <11-20> direction. A TTV of the silicon carbide substrate is less than or equal to 3 µm. The first main surface includes a first central region surrounded by a square having each side of 90 mm. An intersection of diagonal lines of the first central region coincides with a center of the first main surface. The first central region is constituted of nine square regions each having each side of 30 mm. A maximum LTV among the nine square regions is less than or equal to 1 µm. An arithmetic mean roughness Sa in a second central region is less than or equal to 0.1 nm, the second central region being surrounded by a square centering on the intersection and having each side of 250 μm.

(2) In the silicon carbide substrate according to (1), the TTV may be less than or equal to 2 μm.

(3) A silicon carbide epitaxial substrate according to the present disclosure includes a silicon carbide substrate and a silicon carbide epitaxial layer. The silicon carbide substrate includes a first main surface and a second main surface opposite to the first main surface, the silicon carbide substrate being composed of silicon carbide having a polytype of 4H. The silicon carbide epitaxial layer is in contact with the first main surface. A thickness of the silicon carbide epitaxial layer is more than or equal to 10 μm. The silicon carbide epitaxial layer includes a third main surface in contact with the first main surface and a fourth main surface opposite to the third main surface. A maximum diameter of the fourth main surface is more than or equal to 150 mm. The fourth main surface corresponds to a plane inclined relative to a {0001} plane at an off angle of more than 0° and less than or equal to 4° in a <11-20> direction. A TTV of the silicon carbide epitaxial substrate is less than or equal to 3 μm. The fourth main surface includes a first central region surrounded by a square having each side of 90 mm. An intersection of diagonal lines of the first central region coincides with a center of the fourth main surface. The first central region is constituted of nine square regions each having each side of 30 mm. A maximum LTV among the nine square regions is less than or equal to 1 μm. An arithmetic mean roughness Sa in a second central region is less than or equal to 0.12 nm, the second central region being surrounded by a square centering on the intersection and having each side of 250 μm. The fourth main surface has no light emitting region having a length of more than or equal to 26 μm in a <1-100> direction when observed with photoluminescence light.

(4) In the silicon carbide epitaxial substrate according to (3), a thickness of the silicon carbide epitaxial layer is less than or equal to 30 μm.

Details of Embodiments of the Present Disclosure

The following describes embodiments of the present disclosure with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification.

First Embodiment

First, the following describes a configuration of a silicon carbide substrate according to a first embodiment.

Figure 2:
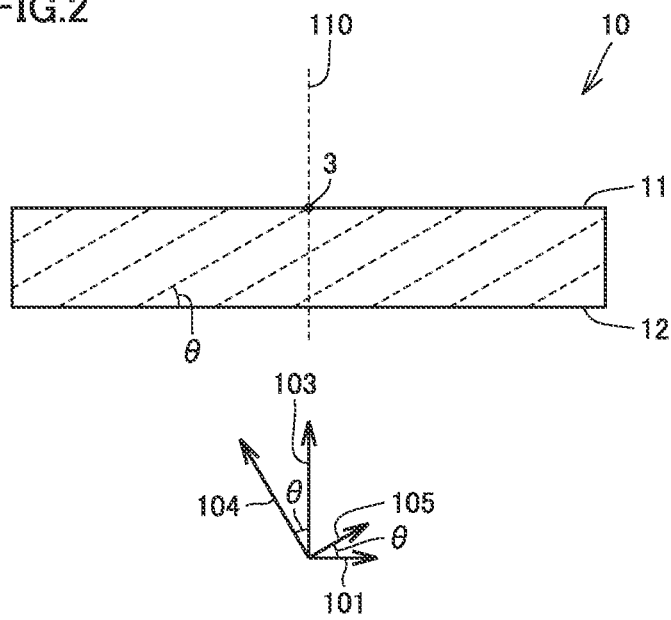
FIG. 2 is a schematic cross sectional view taken along a II-II line of FIG. 1.

As shown in FIG. 1 and FIG. 2, a silicon carbide substrate 10 according to the first embodiment has a first main surface 11 and a second main surface 12. Second main surface 12 is opposite to first main surface 11. Silicon carbide substrate 10 is constituted of silicon carbide having a polytype of 4H, for example. First main surface 11 corresponds to a plane inclined relative to a {0001} plane by more than 0° and less than or equal to 4° in a <11-20> direction. That is, an off angle θ of first main surface 11 is more than 0° and less than or equal to 4°. An off direction 105 of first main surface 11 is the <11-20> direction. First main surface 11 may correspond to a plane angled off by less than or equal to about 4° relative to a (0001) plane and second main surface 12 may correspond to a plane angled off by less than or equal to 4° relative to a (000-1) plane. Alternatively, first main surface 11 may correspond to a plane angled off by less than or equal to about 4° relative to the (000-1) plane and second main surface 12 may correspond to a plane angled off by less than or equal to 4° relative to the (0001) plane. A fourth direction 104 is a direction perpendicular to the {0001} plane.

As shown in FIG. 1, first main surface 11 has a substantially circular shape, for example. First main surface 11 includes a first central region 1. First central region 1 is surrounded by a square having each side of 90 mm. An intersection of diagonal lines of first central region 1 coincides with center 3 of first main surface 1. When first main surface 11 is seen in a thickness direction 103, first central region 1 is a region surrounded by a square that is rotationally symmetrical with respect to center 3, for example. When the outer edge of first main surface 11 defines a circle, center 3 of first main surface 11 is the center of the circle. When the outer edge of first main surface 11 has a circular arc portion and an orientation flat portion in the form of a straight line, center 3 of first main surface 11 is the center of a circle formed along the circular arc portion. First central region 1 has a first side parallel to a first direction 101. First direction 101 is a direction obtained by projecting off direction 105 on first main surface 11. First central region 1 has a second side that is continuous to the first side and that is parallel to a second direction 102. The second side corresponds to a <1-100> direction.

As shown in FIG. 1, first central region 1 is constituted of nine square regions 25 each having each side of 30 mm. Three square regions 25 are disposed along first direction 101 and three square regions 25 are disposed along second direction 102. In other words, when it is assumed that first direction 101 represents rows and second direction 102 represents columns, square regions 25 are disposed in 3 rows×3 columns.

Thickness direction 103 is a direction from second main surface 12 toward first main surface 11. When first main surface 11 is a flat surface, thickness direction 103 is a direction perpendicular to first main surface 11. When first main surface 11 is a curved surface, thickness direction 103 may be a direction perpendicular to the least squares plane of first main surface 11, for example. It should be noted that the least squares plane refers to a plane in which a, b, c, and d are determined such that the sum of squares of the minimum distance between a certain plane (ax+by+cz+d=0) and coordinates $(x_i, y_i, z_i)$ representing a position on a surface of an observed object becomes minimum.

When seen in thickness direction 103, maximum diameter 120 of first main surface 11 is more than or equal to 150 mm. Maximum diameter 120 may be more than or equal to 200 mm or may be more than or equal to 250 mm, for example. The upper limit of maximum diameter 120 is, for example, 300 mm although the upper limit is not limited particularly. Maximum diameter 120 represents a maximum straight line distance between different two points on a circumferential edge of first main surface 11.

(TTV: Total Thickness Variation)

$$TTV = |T1 - T2| \quad \text{(Formula 1)}$$

The TTV is measured in the following procedure, for example. First, second main surface 12 of silicon carbide substrate 10 is entirely adsorbed onto a flat adsorption surface. Next, an image of entire first main surface 11 is obtained optically. As shown and indicated in FIG. 3 and Formula 1, the TTV represents a value obtained by subtracting a height T2 from a height T1 with second main surface 12 being entirely adsorbed to the flat adsorption surface. Height T1 is a height from second main surface 12 to an uppermost point 21 of first main surface 11, whereas height T2 is a height from second main surface 12 to a lowermost point 22 of first main surface 11. In other words, the TTV represents a value obtained by subtracting the minimum distance between second main surface 12 and first main surface 11 from the maximum distance between second main surface 12 and first main surface 11 in the direction perpendicular to second main surface 12. That is, the TTV represents a distance between a plane 113 and a plane 114. Plane 113 passes through uppermost point 21 and is parallel to second main surface 12, and plane 114 passes through lowermost point 22 and is parallel to second main surface 12. The TTV of silicon carbide substrate 10 according to the present embodiment is less than or equal to 3 μm. The TTV may be less than or equal to 2.5 μm, may be less than or equal to 2 μm, or may be less than or equal to 1.8 μm.

(LTV: Local Thickness Variation)

$$LTV = |T4 - T3| \quad \text{(Formula 2)}$$

The LTV is measured in the following procedure, for example. First, second main surface 12 of silicon carbide substrate 10 is entirely adsorbed onto a flat adsorption surface. Next, an image of a certain local region (for example, each of nine square regions 25) is obtained optically. As shown and indicated in FIG. 4 and Formula 2, the LTV represents a value obtained by subtracting a height T3 from a height T4 with second main surface 12 being entirely adsorbed to the flat adsorption surface. Height T3 is a height from second main surface 12 to a lowermost point 23 of first main surface 11, whereas height T4 is a height from second main surface 12 to an uppermost point 24 of first main surface 11. In other words, the LTV represents a value obtained by subtracting the minimum distance between second main surface 12 and first main surface 11 from the maximum distance between second main surface 12 and first main surface 11 in the direction perpendicular to second main surface 12. That is, the LTV represents a distance between a plane 116 and a plane 117. Plane 116 passes through uppermost point 24 and is parallel to second main surface 12, and plane 117 passes through lowermost point 23 and is parallel to second main surface 12. As described above, first central region 1 is constituted of nine square regions 25 each having each side of 30 mm (see FIG. 1). The respective LTVs of nine square regions 25 are measured and the maximum LTV among them is determined. In silicon carbide substrate 10 according to the present embodiment, the maximum LTV among nine square regions 25 is less than or equal to 1 μm. The maximum LTV among nine square regions 25 may be less than or equal to 0.9 μm.

Each of the TTV and the LTV is an index quantitatively indicating a degree of flatness of first main surface 11 of silicon carbide substrate 10. The index can be measured by using "Tropel FlatMaster (registered trademark)" provided by Corning Tropel, for example.

(Arithmetic Mean Roughness Sa)

An arithmetic mean roughness Sa is a parameter obtained by extending two-dimensional arithmetic mean roughness Ra to three dimensions. Arithmetic mean roughness Sa is a three-dimensional surface property parameter defined in International Standard ISO25178. Arithmetic mean roughness Sa can be measured using a white light interferometric microscope, for example. As the white light interferometric microscope, BW-D507 provided by NIKON can be used, for example. An objective lens thereof has a magnification of 20×, for example.

As shown in FIG. 1, a second central region 2 is a region that is surrounded by a square centering on intersection 3 and having each side of 250 μm. Second central region 2 has a shape analogous to first central region 1. Second central region 2 has a first side parallel to the first side of first central region 1, for example. Similarly, second central region 2 has a second side parallel to the second side of first central region 1, for example. Arithmetic mean roughness Sa in second central region 2 is less than or equal to 0.1 nm. Arithmetic mean roughness Sa in second central region 2 may be less than or equal to 0.09 nm.

Next, the following describes a method for manufacturing the silicon carbide substrate according to the first embodiment.

For example, silicon carbide substrate 10 is prepared by slicing, using a wire saw, an ingot composed of a silicon carbide single crystal manufactured by a sublimation method. Silicon carbide substrate 10 is composed of silicon carbide having a polytype of 4H, for example. Silicon carbide substrate 10 has first main surface 11 and second main surface 12 opposite to first main surface 11. First main surface 11 corresponds to a plane angled off by less than or equal to 4° relative to the {0001} plane in the <11-20> direction, for example. First main surface 11 and second main surface 12 are ground and are then subjected to mechanical polishing and CMP (Chemical Mechanical Polishing).

Figure 5:
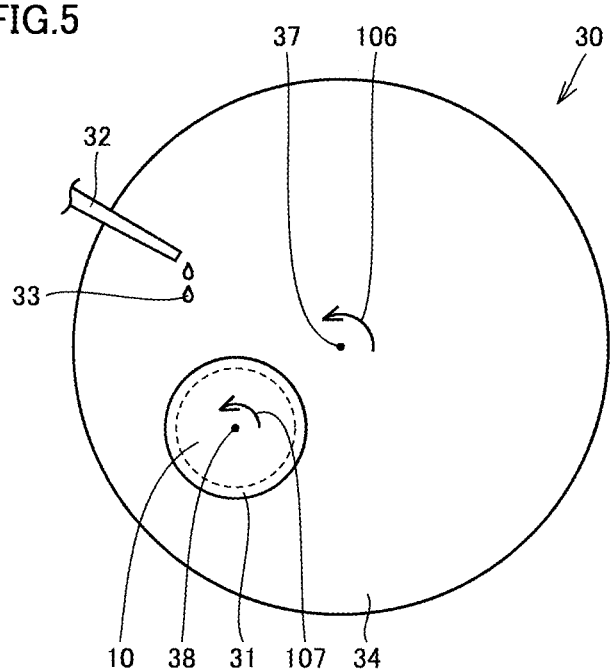
FIG. 5 is a schematic plan view showing a method for manufacturing the silicon carbide substrate according to the first embodiment.

Next, the following describes a configuration of a polishing apparatus. A polishing apparatus 30 is a CMP apparatus, for example. As shown in FIG. 5, polishing apparatus 30 mainly has a polishing head 31, a liquid supplying portion 32, and a polishing cloth 34. Polishing cloth 34 is fixed to a surface plate (not shown). As polishing cloth 34, a suede polishing cloth "G804W" provided by Fujibo Ehime can be used, for example.

Figure 6:
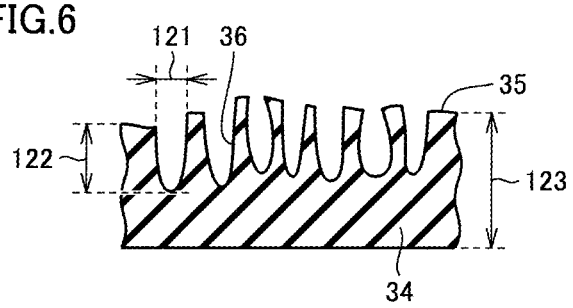
FIG. 6 is a schematic cross sectional view showing a configuration of a polishing cloth used in the method for manufacturing the silicon carbide substrate according to the first embodiment.

As shown in FIG. 6, a plurality of holes 36 are provided in a surface 35 of polishing cloth 34. When viewed in a cross section, the average value of respective widths 121 of the plurality of holes 36 is 100 nm, for example. The average value of respective depths 122 of the plurality of holes 36 is 600 μm, for example. Polishing cloth 34 has a thickness 123 of 1 mm, for example. The widths of the plurality of holes 36 may be different from one another. Similarly, the depths of the plurality of holes 36 may be different from one another.

Next, modification processing is performed. Specifically, as shown in FIG. 5, polishing head 31 and polishing cloth 34 are rotated with a dummy silicon carbide substrate (substrate different from the silicon carbide substrate to be polished in the subsequent polishing) being pressed against surface 35 of polishing cloth 34 while supplying pure water onto polishing cloth 34. The dummy silicon carbide substrate is pressed against polishing cloth 34 at a pressure of 200 g/cm$^2$, for example. The surface plate to which polishing cloth 34 is fixed is rotated around a first rotation axis 37 in a first rotation direction 106. The rotating speed of the surface plate is 50 rpm, for example. First rotation direction 106 is a counter-clockwise direction when seen from above polishing cloth 34, for example.

Polishing head 31 is rotated around a second rotation axis 38 in a second rotation direction 107. The rotating speed of polishing head 31 is 100 rpm, for example. Second rotation direction 107 is the counter-clockwise direction when seen from above polishing cloth 34, for example. Liquid 33 is supplied from liquid supplying portion 32 onto polishing cloth 34. Liquid 33 is pure water, for example. No abrasive grain is included in the pure water. The flow rate of the pure water is 1000 ml/minute, for example. Accordingly, a state of surface 35 of polishing cloth 34 is changed to improve hydrophilicity of surface 35. When pure water is dropped onto surface 35 thus having improved hydrophilicity, a contact angle of the pure water becomes less than or equal to 1° (substantially 0°), for example.

Next, polishing is performed. Specifically, as shown in FIG. 5, polishing head 31 and polishing cloth 34 are rotated with silicon carbide substrate 10, which serves as a workpiece, being pressed against surface 35 of polishing cloth 34 while supplying polishing liquid onto polishing cloth 34. Silicon carbide substrate 10 is pressed against polishing cloth 34 at a pressure of 500 g/cm$^2$, for example. The surface plate to which polishing cloth 34 is fixed is rotated around first rotation axis 37 in first rotation direction 106. The rotating speed of the surface plate is 50 rpm, for example. First rotation direction 106 is the counter-clockwise direction when seen from above polishing cloth 34, for example.

Polishing head 31 is rotated around second rotation axis 38 in second rotation direction 107. The rotating speed of polishing head 31 is 100 rpm, for example. Second rotation direction 107 is the counter-clockwise direction when seen from above polishing cloth 34, for example. Liquid 33 is supplied from liquid supplying portion 32 onto polishing cloth 34. Liquid 33 is polishing liquid, for example. The polishing liquid includes abrasive grains such as colloidal silica, for example. As the polishing liquid, "DSC-0902" provided by Fujimi Incorporated can be used, for example. The flow rate of the polishing liquid is 1000 ml/minute, for example.

Figure 7:
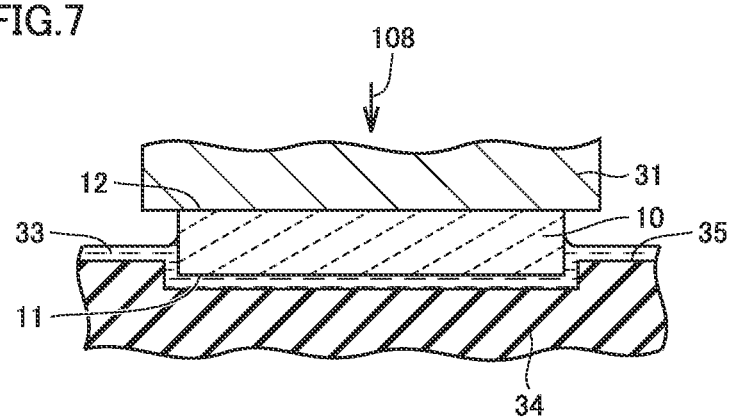
FIG. 7 is a schematic cross sectional view showing the method for manufacturing the silicon carbide substrate according to the first embodiment.

As shown in FIG. 7, during the polishing, silicon carbide substrate 10 is fed with pressure in a direction 108 of polishing cloth 34. Accordingly, silicon carbide substrate 10 is polished with a portion of polishing cloth 34 being recessed. Since the hydrophilicity of surface 35 of polishing cloth 34 has been improved by the modification processing, liquid 33 (polishing liquid) can be sufficiently supplied between silicon carbide substrate 10 and the recessed portion of polishing cloth 34 even under application of a high pressure of more than or equal to 500 g/cm$^2$ onto silicon carbide substrate 10, for example. That is, in the polishing step, silicon carbide substrate 10 is polished with the contact angle in surface 35 of polishing cloth 34 being less than or equal to 1° (substantially 0°). Accordingly, at a high polishing rate, a silicon carbide substrate can be obtained to have a high flatness, a small number of scratches, and a small surface roughness.

Second Embodiment

Next, the following describes a configuration of a silicon carbide epitaxial substrate according to a second embodiment.

Figure 8:
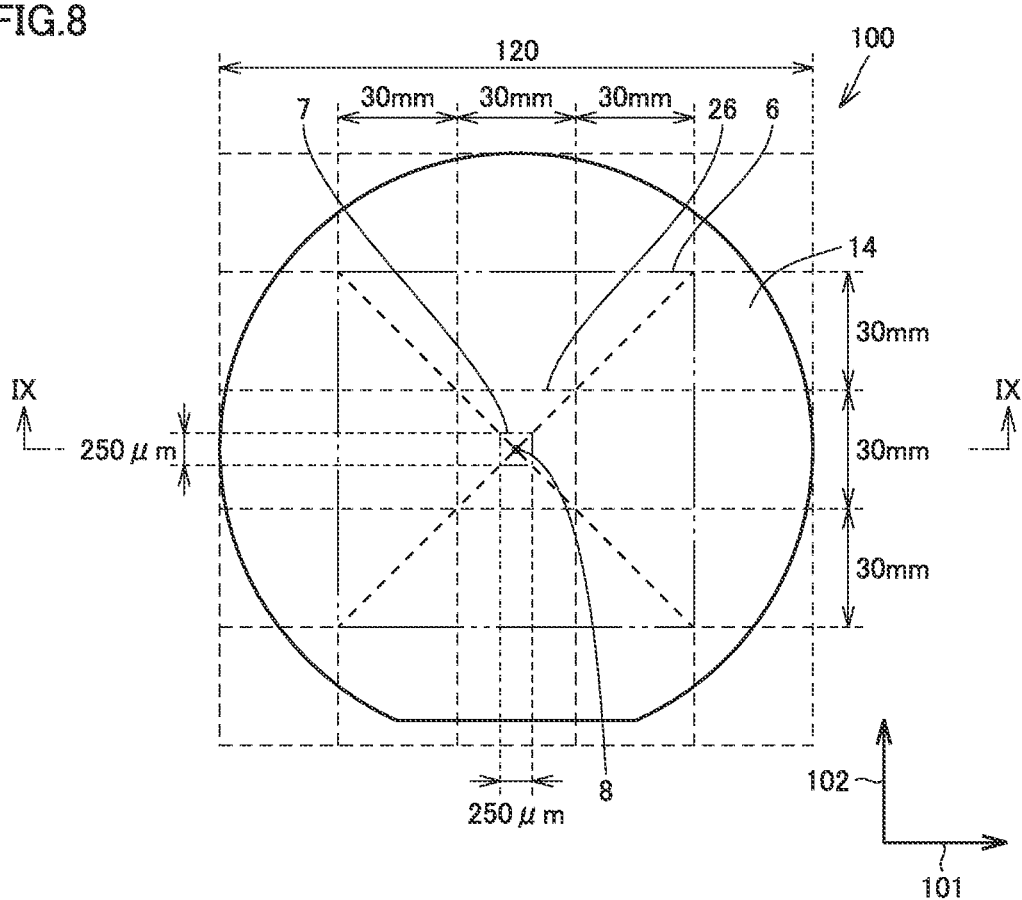
FIG. 8 is a schematic plan view showing a structure of a silicon carbide epitaxial substrate according to a second embodiment.
Figure 9:
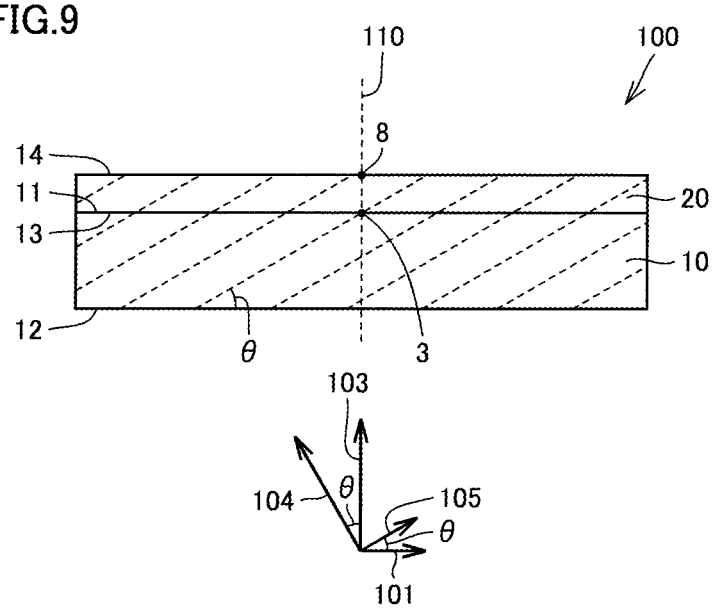
FIG. 9 is a schematic cross sectional view taken along a IX-IX line of FIG. 8.

As shown in FIG. 8 and FIG. 9, a silicon carbide epitaxial substrate 100 according to the second embodiment has a silicon carbide substrate 10 and a silicon carbide epitaxial layer 20. Silicon carbide substrate 10 is, for example, the silicon carbide substrate according to the first embodiment but is not limited to the silicon carbide substrate according to the first embodiment. Silicon carbide substrate 10 has a first main surface 11 and a second main surface 12. Second main surface 12 is opposite to first main surface 11. Silicon carbide substrate 10 is composed of silicon carbide having a polytype of 4H, for example.

As shown in FIG. 9, silicon carbide epitaxial layer 20 is in contact with first main surface 11. Silicon carbide epitaxial layer 20 has a third main surface 13 and a fourth main surface 14. Third main surface 13 is in contact with first main surface 11. Fourth main surface 14 is opposite to third main surface 13. Fourth main surface 14 corresponds to a plane inclined relative to a {0001} plane at an off angle of more than 0° and less than or equal to 4° in a <11-20> direction. That is, an off angle θ of fourth main surface 14 is more than 0° and less than or equal to 4°. An off direction of fourth main surface 14 is the <11-20> direction. Fourth main surface 14 may correspond to a plane angled off by less than or equal to about 4° relative to a (0001) plane and third main surface 13 may correspond to a plane angled off by less than or equal to 4° relative to a (000-1) plane. Alternatively, fourth main surface 14 may correspond to a plane angled off by less than or equal to about 4° relative to the (000-1) plane and third main surface 13 may correspond to a plane angled off by less than or equal to 4° relative to the (0001) plane.

The thickness of silicon carbide epitaxial layer 20 is more than or equal to 10 μm. The thickness of silicon carbide epitaxial layer 20 is not particularly limited, and may be more than or equal to 15 μm or may be more than or equal to 20 μm, for example. The thickness of silicon carbide epitaxial layer 20 is not particularly limited, and may be less than or equal to 30 m or may be less than or equal to 25 μm, for example.

As shown in FIG. 8, fourth main surface 14 has a substantially circular shape, for example. Fourth main surface 14 includes a first central region 6. First central region 6 is surrounded by a square having each side of 90 mm. An intersection of diagonal lines of first central region 6 coincides with center 8 of fourth main surface 14. When the outer edge of fourth main surface 14 defines a circle, center 8 of fourth main surface 14 is the center of the circle. When the outer edge of fourth main surface 14 has a circular arc portion and an orientation flat portion in the form of a straight line, center 8 of fourth main surface 14 is the center of a circle formed along the circular arc portion. When fourth main surface 14 is seen in a thickness direction 103, first central region 6 is a region surrounded by a square that is rotationally symmetrical with respect to center 8, for example. First central region 6 has a first side parallel to first direction 101. First direction 101 is a direction obtained by projecting the <11-20> direction on first main surface 11. First central region 6 has a second side that is continuous to the first side and that is parallel to second direction 102. The second side corresponds to a <1-100> direction.

As shown in FIG. 8, first central region 6 is constituted of nine square regions 25 each having each side of 30 mm. Three square regions 25 are disposed along first direction 101 and three square regions 25 are disposed along second direction 102. In other words, when it is assumed that first direction 101 represents rows and second direction 102 represents columns, square regions 25 are disposed in 3 rows×3 columns.

Thickness direction 103 is a direction from second main surface 12 toward fourth main surface 14. When fourth main surface 14 is a flat surface, thickness direction 103 is a direction perpendicular to fourth main surface 11. When fourth main surface 14 is a curved surface, thickness direction 103 may be a direction perpendicular to the least squares plane of fourth main surface 14, for example. It should be noted that the least squares plane refers to a plane in which a, b, c, and d are determined such that the sum of squares of the minimum distance between a certain plane (ax+by+cz+d=0) and coordinates ($x_i$, $y_i$, $z_i$) representing a position on a surface of an observed object becomes minimum.

When seen in thickness direction 103, maximum diameter 120 of fourth main surface 14 is more than or equal to 150 mm. Maximum diameter 120 may be more than or equal to 200 mm or may be more than or equal to 250 mm, for example. The upper limit of maximum diameter 120 is, for example, 300 mm although the upper limit is not limited particularly. Maximum diameter 120 represents a maximum straight line distance between different two points on a circumferential edge of fourth main surface 14.

Figure 3:
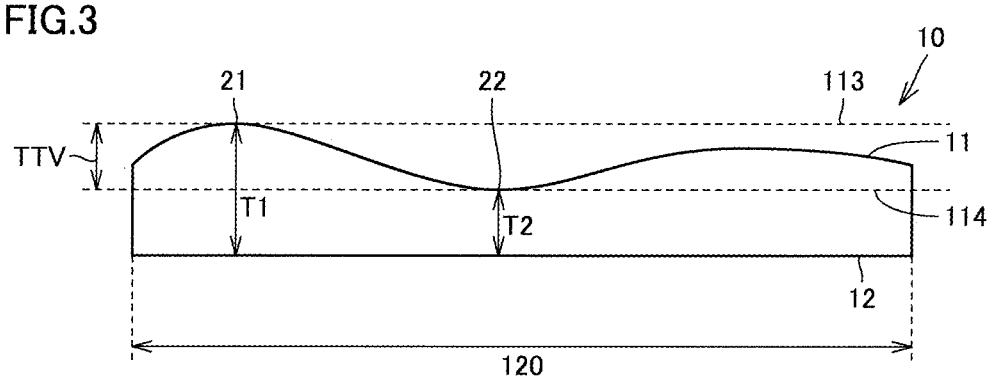
FIG. 3 is a schematic cross sectional view of the substrate to show a method for measuring a TTV.

The TTV of silicon carbide epitaxial substrate 100 according to the present embodiment is less than or equal to 3 µm. The TTV may be less than or equal to 2.5 µm, may be less than or equal to 2 µm, or may be less than or equal to 1.8 µm. The definition of the TTV and the method for measuring the TTV are as described above. In FIG. 3, first main surface 11 is replaced with fourth main surface 14.

Figure 4:
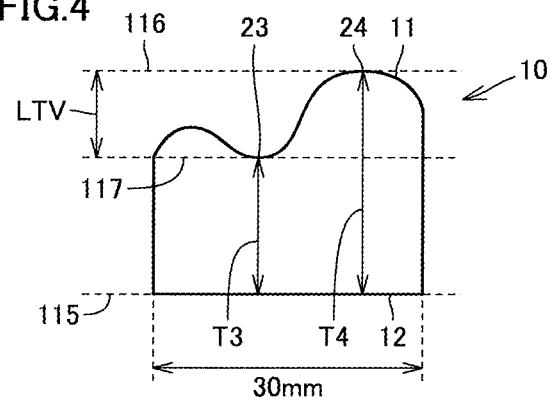
FIG. 4 is a schematic cross sectional view of the substrate to show a method for measuring a LTV.

In silicon carbide epitaxial substrate 100 according to the present embodiment, the maximum LTV among nine square regions 26 is less than or equal to 1 µm. The maximum LTV among nine square regions 26 may be less than or equal to 0.9 µm. The definition of the LTV and the method for measuring the LTV are as described above. In FIG. 4, first main surface 11 is replaced with fourth main surface 14.

As shown in FIG. 8, second central region 7 is a region that is surrounded by a square centering on intersection 3 and having each side of 250 µm. Arithmetic mean roughness Sa in second central region 7 is less than or equal to 0.12 nm. Arithmetic mean roughness Sa in second central region 7 may be less than or equal to 0.11 nm. The definition of arithmetic mean roughness Sa and the method for measuring arithmetic mean roughness Sa are as described above.

(Photoluminescence Measurement Method)

Fourth main surface 14 has no light emitting region having a length of more than or equal to 26 µm in the <1-100> direction when observed with photoluminescence light. The measurement of the photoluminescence light can be performed using a PL imaging apparatus (PLIS-100) provided by PHOTON Design Corporation, for example. The wavelength of the incident light is 313 nm, for example. A light receiving filter is a 750-nm low pass filter, for example. An exposure time is 5 seconds, for example. A specific defect region existing in fourth main surface 14 can be identified as a white light emitting region when observed with photoluminescence light. Fourth main surface 14 may have no light emitting region having a length of more than or equal to 30 µm or may have no light emitting region having a length of more than or equal to 34 µm in the <1-100> direction when observed with photoluminescence light. The light emitting region may be a region continuous to the outer circumference of fourth main surface 14.

Next, the following describes a method for calculating a defect region ratio. An image of the entire fourth main surface 14 is obtained using the above-described PL imaging apparatus (PLIS-100) provided by PHOTON Design Corporation. Based on the image, the area of the entire light emitting region is calculated. A ratio of the area of the entire light emitting region to the area of the entire fourth main surface is determined as the defect region ratio. The defect region ratio of fourth main surface 14 is less than or equal to 5%, for example. The defect region ratio of fourth main surface 14 may be less than or equal to 3%, or may be less than or equal to 1%.

Next, the following describes a method for manufacturing the silicon carbide epitaxial substrate according to the second embodiment.

For example, silicon carbide substrate 10 is prepared using the method for manufacturing the silicon carbide substrate according to the first embodiment. Next, silicon carbide epitaxial layer 20 is formed on silicon carbide substrate 10. Specifically, for example, a CVD (Chemical Vapor Deposition) method is used to epitaxially grow silicon carbide epitaxial layer 20 on first main surface 11 of silicon carbide substrate 10. In the epitaxial growth, silane ($SiH_4$) and propane ($C_3H_8$) are used as source material gas, hydrogen ($H_2$) is used as carrier gas, and nitrogen ($N_2$) is used as dopant gas, for example. The temperature of silicon carbide substrate 10 during the epitaxial growth is more than or equal to about 1400° C. and less than or equal to about 1700° C., for example. In this way, silicon carbide epitaxial substrate 100 is manufactured.

Next, functions and effects of the present embodiment will be described.

In order to improve a polishing rate of the silicon carbide substrate, it is effective to increase a pressure applied to the silicon carbide substrate and to increase the rotating speed. However, when polishing is performed at a high rotating speed under application of a high pressure, the polishing liquid is less likely to be supplied between the polishing cloth and the central portion of the surface of the silicon carbide substrate. Accordingly, the outer circumferential portion of the silicon carbide substrate is more likely to be polished as compared with the central portion of the silicon carbide substrate. As a result, the central portion of the silicon carbide substrate has a protruding shape, thus resulting in a deteriorated flatness. Moreover, since a sufficient amount of the polishing liquid is not supplied between the polishing cloth and the surface of the silicon carbide substrate, a larger number of surface scratches are produced, thus resulting in a deteriorated surface roughness.

In the present embodiment, the modification processing is performed onto the surface of the polishing cloth. Accordingly, the hydrophilicity of the surface of the polishing cloth can be improved. Therefore, even when the silicon carbide substrate is polished at a high rotating speed under application of a high pressure, the polishing liquid can be sufficiently supplied between the polishing cloth and the surface of the silicon carbide substrate. This leads to improved flatness, reduced surface scratches, and reduced surface roughness of the silicon carbide substrate. As a result, occurrence of surface defects in the silicon carbide epitaxial layer formed on the silicon carbide substrate can be suppressed.

Examples

Silicon carbide substrates 10 according to samples 1 to 3 were polished under the following conditions. In the polishing of each of samples 1 and 2, a polishing cloth made of suede was used. The polishing cloth used in the polishing of sample 1 was a suede polishing cloth "G804W" (suede 1) provided by Fujibo Ehime. The polishing cloth used in the polishing of sample 2 was a suede polishing cloth "supreme" (suede 2) provided by Nitta Haas. The polishing cloth used in the polishing of sample 3 was a nonwoven fabric "SUBA800" provided by Nitta Haas.

Before the polishing of sample 1, the modification processing was performed onto the polishing cloth. On the other hand, before the polishing of each of samples 2 and 3, no modification processing was performed onto the polishing cloth. The diameter of the surface plate was 600 mm. In the modification processing of sample 1, polishing head 31 and polishing cloth 34 were rotated with a dummy silicon carbide substrate being pressed against surface 35 of polishing cloth 34 while supplying pure water onto polishing cloth 34 (see FIG. 5). The pressure on first main surface 11 was set to 200 g/cm$^2$. The rotating speed of the surface plate to which polishing cloth 34 was fixed was set to 50 rpm. The rotating speed of polishing head 31 was set to 100 rpm. No abrasive grain is included in the pure water. The flow rate of the pure water was set to 1000 ml/minute. A time for the modification processing was set to 4 hours.

Next, a contact angle of the surface of the polishing cloth used for the polishing of each of samples 1 to 3 was measured. The contact angle was measured by a liquid dropping method. Specifically, pure water is dropped onto the surface of the polishing cloth to measure an angle between the surface of the pure water and the surface of the polishing cloth. The respective contact angles of the polishing clothes used in the polishing of samples 1 to 3 are 0°, 85° and 130°. Considering the polishing clothes used in the polishing of samples 1 to 3, by performing the modification processing, hydrophilicity was considered to be improved to result in a small contact angle.

Next, silicon carbide substrates 10 according to samples 1 to 3 were polished. Polishing head 31 and polishing cloth 34 were rotated with silicon carbide substrate 10, which serves as a workpiece, being pressed against surface 35 of polishing cloth 34 while supplying polishing liquid onto polishing cloth 34. The pressure on first main surface 11 was set to 500 g/cm$^2$. The rotating speed of the surface plate to which polishing cloth 34 was fixed was set to 50 rpm. The rotating speed of polishing head 31 was set to 100 rpm. As the polishing liquid, "DSC-0902" provided by Fujimi Incorporated was used. The flow rate of the polishing liquid was set to 1000 ml/minute. The polishing rates of samples 1 to 3 were respectively 190 nm/hour, 125 nm/hour, and 70 nm/hour.

Next, the TTVs and LTVs (maximum) of silicon carbide substrates 10 according to samples 1 to 3 and arithmetic surface roughnesses Sa of silicon carbide substrates 10 according to samples 1 to 3 before epitaxial growth were measured. Each of the TTVs was measured by the above-described method. Each of the LTVs (maximum) is the maximum LTV among nine square regions 25 included in first central region 1 of the first main surface. Each of nine square regions 25 has each side of 30 mm. The LTV was measured by the above-described method. Each of arithmetic surface roughnesses Sa before the epitaxial growth was measured in second central region 2 of the first main surface (see FIG. 2). Second central region 2 is a region surrounded by a square having each side of 250 μm. Arithmetic surface roughness Sa was measured by the above-described method.

TABLE 1

| Sample Number | Polishing Cloth Material | Contact Angle [°] | TTV [μm] | LTV (Maximum) [μm] | Arithmetic Surface Roughness Sa before Epitaxial Growth [nm] | Arithmetic Surface Roughness Sa after Epitaxial Growth [nm] | Defect Region Ratio [%] | Polishing Rate [nm/Hour] |
|---|---|---|---|---|---|---|---|---|
| Sample 1 | Suede 1 | 0 | 1.665 | 0.8321 | 0.086 | 0.107 | 0 | 190 |
| Sample 2 | Suede 2 | 85 | 3.181 | 1.2591 | 0.142 | 0.189 | 6.1 | 125 |
| Sample 3 | Nonwoven Fabric | 130 | 4.074 | 1.7192 | 0.166 | 0.225 | 10.4 | 70 |

As shown in Table 1, the TTVs of silicon carbide substrates 10 according to samples 1 to 3 were 1.665 μm, 3.181 μm, and 4.074 μm, respectively. The LTVs (maximum) of silicon carbide substrates 10 according to samples 1 to 3 were 0.8321 μm, 1.2591 μm, and 1.7192 μm, respectively. Arithmetic surface roughnesses Sa of silicon carbide substrates 10 according to samples 1 to 3 before the epitaxial growth were 0.086 nm, 0.142 nm, and 0.166 nm, respectively.

Next, silicon carbide epitaxial layer 20 was formed on each of silicon carbide substrates 10 according to samples 1 to 3. Then, arithmetic surface roughness Sa after the epitaxial growth and the defect region ratio were measured. Arithmetic surface roughness Sa after the epitaxial growth was measured in second central region 7 of the fourth main surface (see FIG. 8). Second central region 7 is a region surrounded by a square having each side of 250 μm. Arithmetic surface roughness Sa and the defect region ratio were measured by the above-described methods.

As shown in Table 1, arithmetic surface roughnesses Sa of samples 1 to 3 after the epitaxial growth were 0.107 nm, 0.189 nm, and 0.225 nm, respectively. The defect region ratios of samples 1 to 3 were 0%, 6.1%, and 10.4%, respectively.

Figure 10:
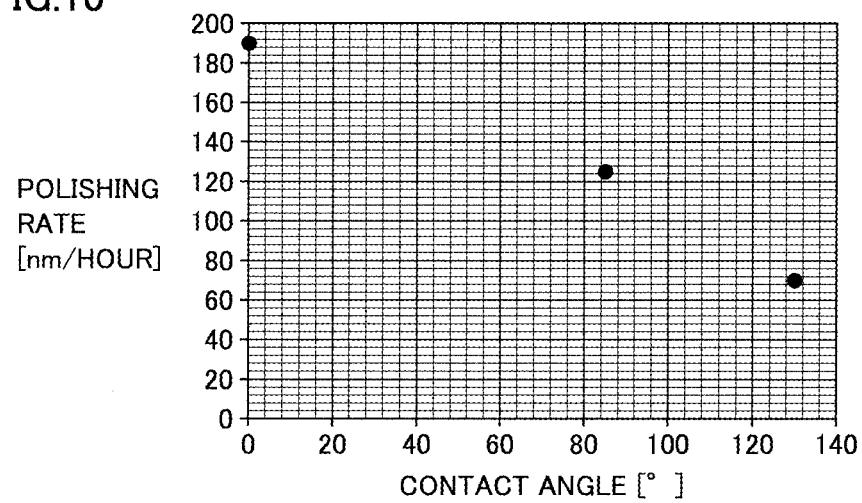
FIG. 10 shows a relation between a polishing rate and a contact angle.
Figure 11:
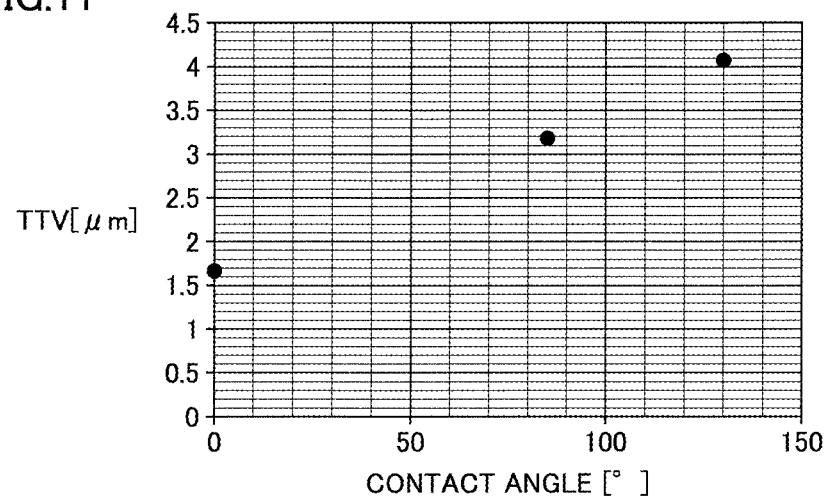
FIG. 11 shows a relation between the TTV and the contact angle.
Figure 12:
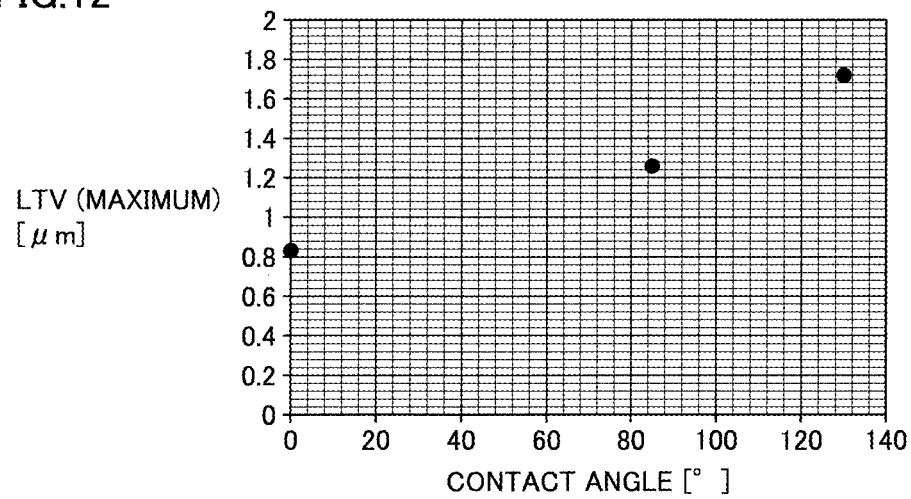
FIG. 12 shows a relation between the LTV (maximum) and the contact angle.

FIG. 10 shows a relation between the polishing rate and the contact angle. As shown in FIG. 10, as the contact angle becomes smaller, the polishing rate becomes higher. FIG. 11 shows a relation between the TTV and the contact angle. As shown in FIG. 11, as the contact angle becomes smaller, the TTV becomes smaller. FIG. 12 shows a relation between the LTV (maximum) and the contact angle. As shown in FIG. 12, as the contact angle becomes smaller, the LTV (maximum) becomes smaller.

Figure 13:
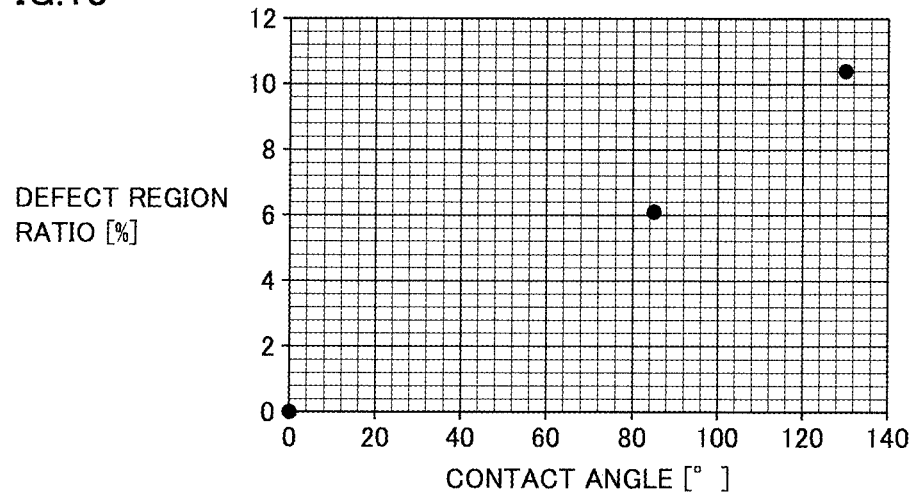
FIG. 13 shows a relation between a defect region ratio and the contact angle.
Figure 14:
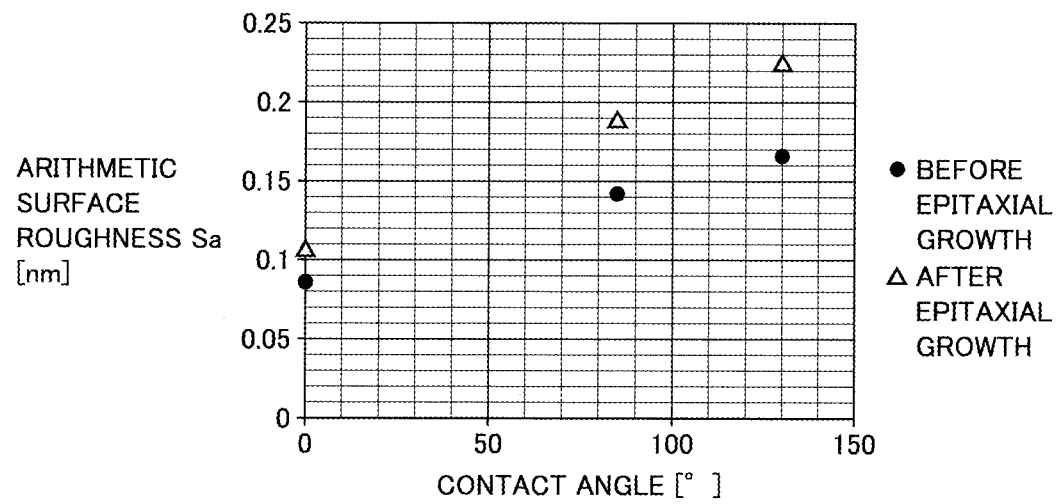
FIG. 14 shows a relation between an arithmetic surface roughness Sa and the contact angle.

FIG. 13 shows a relation between the defect region ratio and the contact angle. As shown in FIG. 13, as the contact angle becomes smaller, the defect region ratio becomes smaller. FIG. 14 shows a relation between arithmetic surface roughness Sa and the contact angle. As shown in FIG. 14, as the contact angle becomes smaller, arithmetic surface roughness Sa before the epitaxial growth and arithmetic surface roughness Sa after the epitaxial growth become smaller.

From the above results, it was confirmed that the contact angle can be reduced by performing the modification processing onto the surface of the polishing cloth. Moreover, it was confirmed that by polishing the silicon carbide substrate using such a polishing cloth having a low contact angle, the polishing rate of the silicon carbide substrate is improved. Further, it was confirmed that by polishing the silicon carbide substrate using such a polishing cloth having a low contact angle, the surface roughness can be reduced while improving the flatness of the silicon carbide substrate. As a result, it was confirmed that surface defects in the silicon carbide epitaxial layer formed on the silicon carbide substrate can be suppressed.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST 1, 6: first central region; 2, 7: second central region; 3, 8: intersection; 10: silicon carbide substrate; 11: first main surface; 12: second main surface; 13: third main surface; 14: fourth main surface; 20: silicon carbide epitaxial layer, 21, 24: uppermost point; 22, 23: lowermost point; 25, 26: square region; 30: polishing apparatus; 31: polishing head; 32: liquid supplying portion; 33: liquid; 34: polishing cloth; 35: surface; 36: hole; 37: first rotation axis; 38: second rotation axis; 100: silicon carbide epitaxial substrate; 101: first direction; 102: second direction; 103: thickness direction; 104: fourth direction; 105: off direction; 106: first rotation direction; 107: second rotation direction; 108: direction; 110: straight line; 113, 114, 116, 117: plane; 120: maximum diameter; 121: width; 122: depth; 123: thickness.

The invention claimed is:

1. A silicon carbide substrate comprising a first main surface and a second main surface opposite to the first main surface, the silicon carbide substrate being composed of silicon carbide having a polytype of 4H, wherein
a maximum diameter of the first main surface is more than or equal to 150 mm and less than or equal to 300 mm,
the first main surface corresponds to a plane inclined relative to a {0001} plane by more than 0° and less than or equal to 4° in a <11-20> direction,
a Total Thickness Variation (TTV) of the silicon carbide substrate is more than 0 µm and less than or equal to 3 µm,
the first main surface includes a first central region surrounded by a square having a side of 90 mm, and an intersection of diagonal lines of the first central region coincides with a center of the first main surface,
the first central region is constituted of nine square regions each having a side of 30 mm,
a maximum Local Thick Variation (LTV) among the nine square regions is more than 0 µm and less than or equal to 1 µm, and
an arithmetic mean roughness Sa in a second central region is more than 0 µm and less than or equal to 0.1 nm, the second central region being a square centered on the intersection and having a side of 250 µm.

2. The silicon carbide substrate according to claim 1, wherein the TTV is more than 0 µm and less than or equal to 2 µm.

3. A silicon carbide epitaxial substrate comprising:
a silicon carbide substrate including a first main surface and a second main surface opposite to the first main surface, the silicon carbide substrate being composed of silicon carbide having a polytype of 4H; and
a silicon carbide epitaxial layer in contact with the first main surface, wherein
a thickness of the silicon carbide epitaxial layer is more than or equal to 10 µm,
the silicon carbide epitaxial layer includes a third main surface in contact with the first main surface and a fourth main surface opposite to the third main surface,
a maximum diameter of the fourth main surface is more than or equal to 150 mm and less than or equal to 300 mm,
the fourth main surface corresponds to a plane inclined relative to a {0001} plane at an off angle of more than 0° and less than or equal to 4° in a <11-20> direction,
a Total Thickness Variation (TTV) of the silicon carbide epitaxial substrate is more than 0 µm and less than or equal to 3 µm,
the fourth main surface includes a first central region surrounded by a square having a side of 90 mm, and an intersection of diagonal lines of the first central region coincides with a center of the fourth main surface,
the first central region is constituted of nine square regions each having a side of 30 mm,
a maximum Local Thick Variation (LTV) among the nine square regions is more than 0 µm and less than or equal to 1 µm,
an arithmetic mean roughness Sa in a second central region is more than 0 µm and less than or equal to 0.12 nm, the second central region being a square centered on the intersection and having a side of 250 µm, and
the fourth main surface has no light emitting region having a length of more than or equal to 26 µm in a <1-100> direction when observed with photoluminescence light under a condition that a wavelength of an incident light is 313 nm.

4. The silicon carbide epitaxial substrate according to claim 3, wherein a thickness of the silicon carbide epitaxial layer is more than or equal to 10 µm and less than or equal to 30 µm.

* * * * *